(12) United States Patent
Takeda et al.

(10) Patent No.: US 7,834,948 B2
(45) Date of Patent: Nov. 16, 2010

(54) ACTIVE MATRIX SUBSTRATE AND LIQUID CRYSTAL DISPLAY DEVICE

(75) Inventors: Naoki Takeda, Mie (JP); Yukikazu Shimato, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 649 days.

(21) Appl. No.: 11/569,994

(22) PCT Filed: Jun. 13, 2004

(86) PCT No.: PCT/JP2005/010791
§ 371 (c)(1),
(2), (4) Date: Dec. 4, 2006

(87) PCT Pub. No.: WO2005/121884
PCT Pub. Date: Dec. 22, 2005

(65) Prior Publication Data
US 2009/0256980 A1    Oct. 15, 2009

(30) Foreign Application Priority Data
Jun. 11, 2004    (JP) ............................. 2004-174508

(51) Int. Cl.
*G02F 1/1343* (2006.01)
*G02F 1/1335* (2006.01)
(52) U.S. Cl. ........................................ 349/39; 349/190
(58) Field of Classification Search .................. 349/1, 349/5, 38, 39, 190, 46, 110, 129
See application file for complete search history.

(56) References Cited

U.S. PATENT DOCUMENTS

| 5,250,931 A | * | 10/1993 | Misawa et al. .............. 345/206 |
| 5,258,705 A | * | 11/1993 | Okamoto et al. ............ 324/770 |
| 5,672,888 A | | 9/1997 | Nakamura |

(Continued)

FOREIGN PATENT DOCUMENTS

CN        1172962 A      2/1998

(Continued)

OTHER PUBLICATIONS

International Search Report for PCT Application No. PCT/JP2005/010791, mailed Aug. 23, 2005.

*Primary Examiner*—Akm E Ullah
(74) *Attorney, Agent, or Firm*—Keating & Bennett, LLP (57) ABSTRACT

In an active matrix substrate 10 of a liquid crystal display device in which a picture element electrode 18 on an interlayer insulator 17 and an electrode 16*d* located in a layer below the interlayer insulator 17 are connected electrically to each other through a contact hole 17*a* formed in the interlayer insulator 17 and another electrode 13 is arranged under the electrode 16*d* so as to be opposed to the electrode 16*d* with a control insulator 14 interposed for forming an auxiliary capacitor between the electrodes 16*d* and 13, an opening 20 is formed in a part of the electrode 13 which corresponds to a region of the contact hole 17*a*. With this arrangement, in the case where a defect is formed in the electrode 16*d*, even if a defect is formed in the control insulator 14 through the defect in the electrode 16*d* in forming the contact hole 17*a*, occurrence of leakage between the electrodes 16*d* and 13 can be suppressed with no lowering of the aperture ratio invited.

11 Claims, 10 Drawing Sheets

U.S. PATENT DOCUMENTS

| | | | |
|---|---|---|---|
| 5,754,260 A * | 5/1998 | Ooi et al. | 349/10 |
| 5,852,485 A | 12/1998 | Shimada et al. | |
| 6,414,730 B1 | 7/2002 | Akamatsu et al. | |
| 6,480,577 B1 | 11/2002 | Izumi et al. | |
| 6,654,073 B1 | 11/2003 | Maruyama et al. | |
| 6,667,777 B2 | 12/2003 | Kikkawa et al. | |
| 6,940,564 B2 * | 9/2005 | Murden et al. | 349/1 |
| 7,184,105 B2 * | 2/2007 | Yasukawa | 349/38 |
| 2001/0019374 A1 | 9/2001 | Izumi et al. | |
| 2002/0021374 A1 | 2/2002 | Kikkawa et al. | |
| 2006/0114391 A1 * | 6/2006 | Seo et al. | 349/129 |

FOREIGN PATENT DOCUMENTS

| | | |
|---|---|---|
| EP | 0 554 061 A1 | 8/1993 |
| EP | 0 592 063 A2 | 4/1994 |
| EP | 0 762 184 A1 | 3/1997 |
| JP | 09-015644 | 1/1997 |
| JP | 09-015644 A | 1/1997 |
| JP | 09-162412 | 6/1997 |
| JP | 09-230380 | 9/1997 |
| JP | 10-232412 A | 9/1998 |
| JP | 2001-142097 A | 5/2001 |
| JP | 2001-312222 A | 11/2001 |
| JP | 2002-055360 | 2/2002 |
| JP | 2003-029285 | 1/2003 |
| JP | 2003-029285 A | 1/2003 |
| TW | 487826 | 5/2002 |
| TW | 581912 | 4/2004 |

* cited by examiner

ACTIVE MATRIX SUBSTRATE AND LIQUID CRYSTAL DISPLAY DEVICE

BACKGROUND OF THE INVENTION

1. Field of the Invention

The present invention relates to an active matrix substrate in which a picture element electrode and an electrode respectively located above and below an interlayer insulator are connected to each other through a contact hole of the interlayer insulator and another electrode is formed opposite the electrode for forming an auxiliary capacitor, and particularly relates to a countermeasure for causing less leakage between the electrodes even if a defect is formed in a control insulator between the electrodes in forming the contact hole.

2. Description of the Related Art

In recent years, liquid crystal display devices are small in size, thickness, power consumption, and weight as their features and, therefore, are employed in a variety of electronic appliances. Particularly, an active matrix liquid crystal display device using a switching element as an active element exhibits display characteristics equivalent to a CRT and, accordingly, is widely employed in OA appliances, such as a personal computer, AV appliances, such as a television set or an on-vehicle monitor for a car navigation system, mobile phones, and so on.

Figure 8:
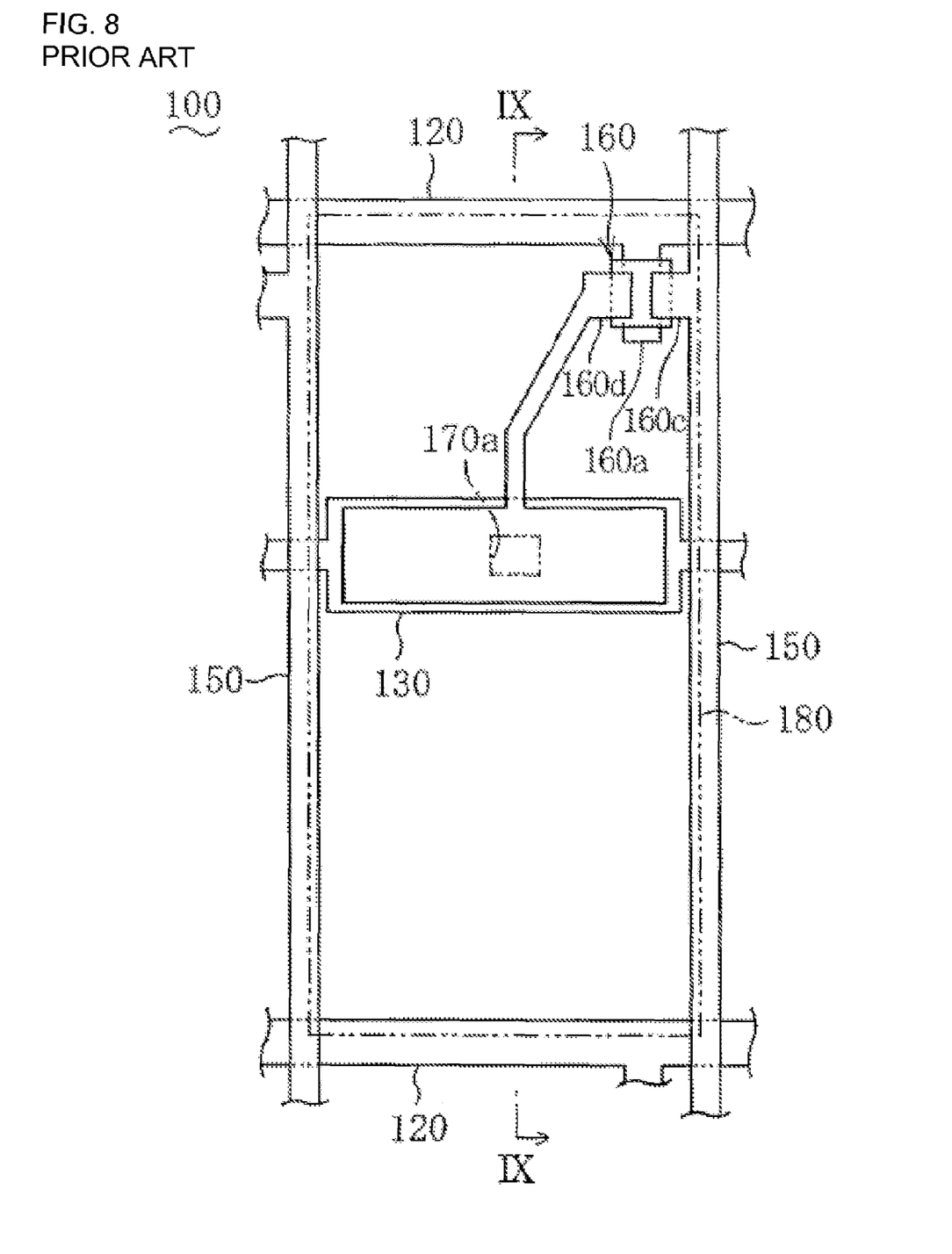
FIG. 8 is a view showing a structure of one of picture element regions of a conventional liquid crystal display device and corresponds to FIG. 1.
Figure 9:
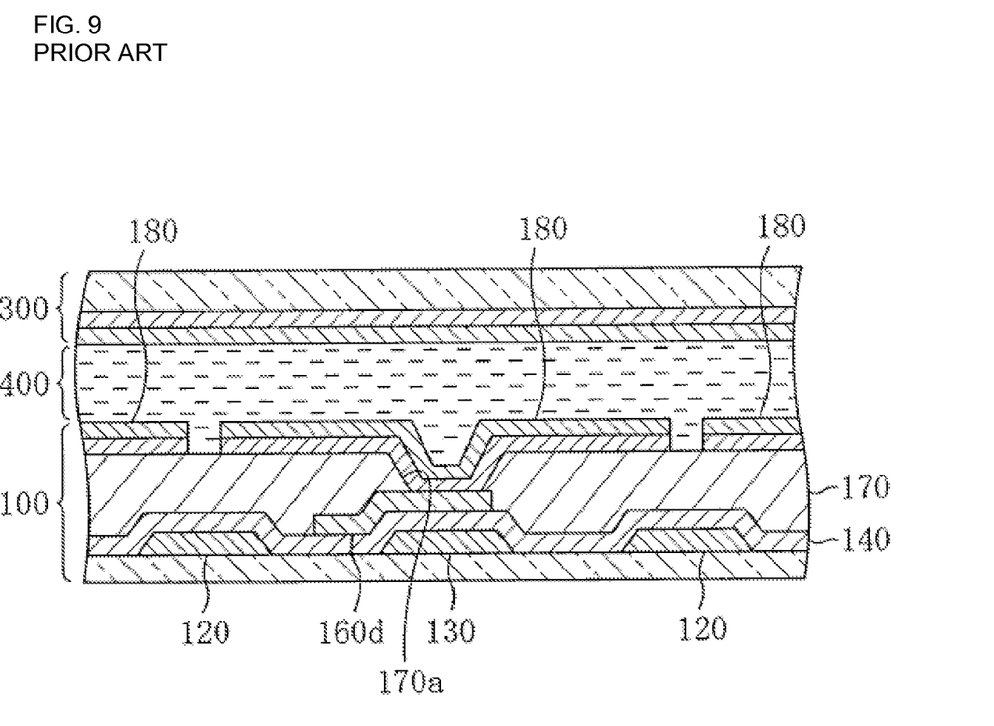
FIG. 9 is an enlarged sectional view taken along the line IX-IX in FIG. 8.

FIG. 8 and FIG. 9 show an example of a structure of an active matrix liquid crystal display device using a TFT (Thin Film Transistor) as a switching element, which is known from Patent Document 1, for example. FIG. 8 is a plan view of a structure of one of picture element regions of an active matrix substrate when viewed from a counter substrate arranged opposite the substrate, and FIG. 9 shows an entire structure of the liquid crystal display device in which a liquid crystal layer is arranged between the substrates and is a sectional view corresponding to an enlarged sectional view taken along VIII-VIII in FIG. 8.

This liquid crystal display device includes an active matrix substrate 100 including a TFT 160 in each picture element region; a counter substrate 300 arranged so as to be opposed to the active matrix substrate 100; and a liquid crystal layer 400 arranged between the substrates 100 and 300. In the active matrix substrate 100, a gate electrode 160a and a source electrode 160c of the TFT 160 are connected electrically to a gate signal line 120 and a data signal line 150, respectively. A drain electrode 160d of the TFT 160 is connected electrically to a picture element electrode 180 located on an interlayer insulator 170 through a contact hole 70a formed in the interlayer insulator 170, the interlayer insulator 170 being provided so as to cover the gate signal line 120, the data signal line 150, and the TFT 160.

Further, under the contact hole 170a (the lower part in FIG. 9), an auxiliary capacitor counter electrode 130 (hereinafter referred to as a Cs counter electrode) is arranged so as to be opposed to a part of the drain electrode 160d with an gate insulator 140 interposed so that the drain electrode 160d and the Cs counter electrode 130 form an auxiliary capacitor.

Referring to the active matrix substrate 100, in the case where a defect, such as a pinhole, is formed in the drain electrode 160d, another defect may be formed in the gate insulator 140 through the defect in the drain electrode 160d in forming the contact hole 170a in the interlayer insulator 170 by etching or the like. As a result, leakage occurs between the drain electrode 160d and the Cs counter electrode 130 through the defect in the gate insulator 140.

Figure 10:
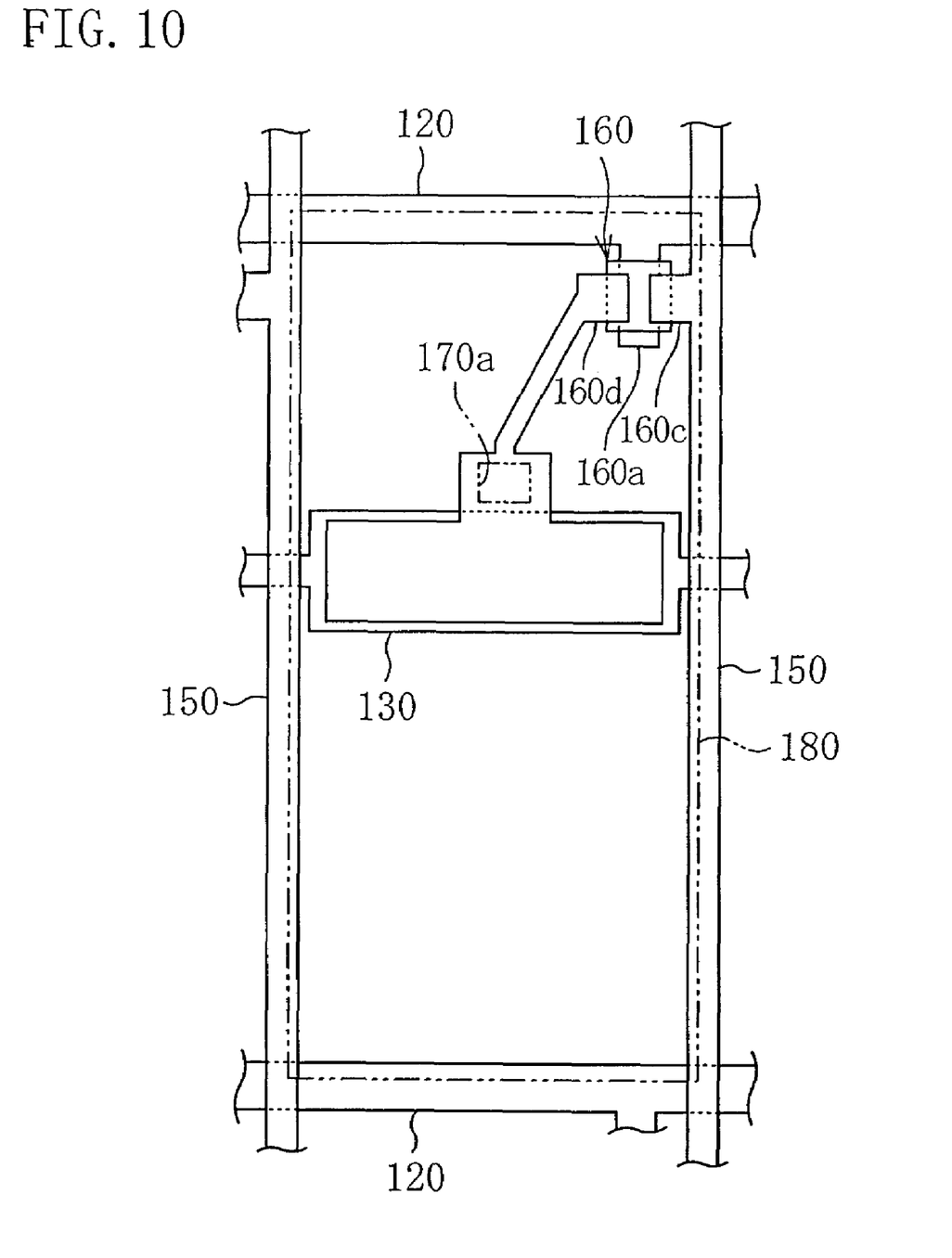
FIG. 10 is a view showing a structure of one picture element regions of an improved liquid crystal display device and corresponds to FIG. 1.

For taking this into consideration, conventionally, the contact hole 170a is arranged in a region other than the region of the Cs counter electrode 130 while the drain electrode 160d is extended to the contact hole 170a so as to be connected to the picture element electrode 180, as disclosed in Patent Document 2 and as shown in FIG. 10 as a plan view. In this way, the Cs counter electrode 130 is not formed in the region of the contact hole 170a so that occurrence of leakage between the drain electrode 160d and the Cs counter electrode 130 is suppressed even if a defect is formed in the gate insulator 140.

Patent Document 1: Japanese Patent Application Laid Open Publication No. 09-230380A (Pages 5 and 6 and FIG. 2)

Patent Document 2: Japanese Patent Application Laid Open Publication No. 2002-55360A (Page 6 and FIG. 4)

SUMMARY OF THE INVENTION

In the region of the contact hole 170a and therearound, however, irregularity in alignment of liquid crystal molecules is caused due to the presence of the depressed part of the contact hole 170a to lower the contrast. For this reason, the conventional case needs to shield light in the aforementioned region by providing a countermeasure, such as the use of a metal film for the drain electrode 160d, resulting in invitation of a lowered aperture ratio.

Further, in order to arrange the contact hole 170a in a region other than the region of the Cs counter electrode 130, the drain electrode 160d must have a protruding form for establishing connection to the picture element electrode 180, which restricts the shape of the drain electrode 160d.

In view of the foregoing, the present invention has been made for an active matrix substrate in which a picture element electrode on an interlayer insulator and an electrode, such as a drain electrode, located in a layer below the interlayer insulator are connected electrically to each other through a contact hole formed in the interlayer insulator and another electrode, such as an auxiliary capacitor counter electrode is arranged under the electrode with an insulator, such as a gate insulator, interposed for forming an auxiliary capacitor between the pair of upper and lower electrodes, and the main object of the present invention is to suppress occurrence of leakage between the electrodes without inviting lowering of the aperture ratio even if a defect is formed in a part of the insulator which is located between the electrodes in forming the contact hole.

In order to attain the above object, in the present invention, an opening corresponding to the region of the contact hole is formed in the lower electrode out of the pair of upper and lower electrodes to suppress occurrence of leakage between the electrodes even if a defect is formed in a part of the insulator which is located between the electrodes.

Specifically, the present invention provides that an active matrix substrate including: an insulating substrate; a plurality of control signal lines arranged on the insulating substrate; a control insulator provided so as to cover the plurality of control signal lines; a plurality of data signal lines arranged on the control insulator so as to intersect with the plurality of control signal lines; a switching element provided in each picture element region, the switching element including a control electrode connected electrically to the corresponding control signal line, a first electrode connected electrically to the corresponding data signal line, and a second electrode arranged on the control insulator; an interlayer insulator having a contact hole in each picture element region and provided so as to cover each switching element; a picture element electrode provided so as to be arranged on the interlayer insulator in each picture element region and connected electrically to the second electrode of the switching element through the contact hole in each picture element region; and an auxiliary capacitor counter electrode arranged so as to be opposed to the second electrode with the control insulator interposed for forming an auxiliary capacitor between itself and the second electrode.

Wherein, an opening is formed in a part of the auxiliary capacitor counter electrode which corresponds to a region of the contact hole. Accordingly, at least a part of the auxiliary capacitor counter electrode which corresponds to the region of the contact hole is opened and no auxiliary capacitor counter electrode is present there. Therefore, even if a defect is formed in the control insulator through a defect in the second electrode in forming the contact hole, occurrence of leakage between the auxiliary capacitor counter electrode and the second electrode through the defect in the control insulator is suppressed significantly when compared with a case with no opening. Further, though the auxiliary capacitance is reduced by the opening, which necessitates supplement thereto in another part, an auxiliary capacitor to be added for supplement is free from its shape, and thus, the aperture ratio is lowered to the least.

In the above arrangement, the opening may range over the whole range of the contact hole.

Further, in the case where the picture element electrode is made of a transparent conductive film, that is, the case where the active matrix substrate is used in a transmissive type liquid crystal display device, both the second electrode and the auxiliary capacitor counter electrode may be formed of a transparent conductive film. This can suppresses occurrence of leakage without lowering the aperture ratio. On the contrary, the second electrode may be formed of a non-transparent conductive film.

Though the above opening may cause irregularity in alignment of liquid crystal molecules around the contact hole to lower the contrast, the contrast is not lowered when using non-transmissive metal for the drain electrode below the contact hole. Hence, the aforementioned problems can be solved.

In the case where the active matrix substrate is used in a reflective type liquid crystal display device, the whole of the picture element electrode may be formed of a reflective conductive film that reflects light. Alternatively, in the case where it is used in a transmissive/reflective type liquid crystal display device, a part of the picture element electrode which corresponds to the contact hole may be made of a reflective conductive film.

Further, in the case of a reflective or transmissive/reflective liquid crystal display device, a part of the picture element electrode which is located on the contact hole is used as a reflecting electrode, thereby solving the above problems without inviting lowering of the aperture ratio and reflectance.

The auxiliary capacitor counter electrode may be made of the same material as the control signal lines.

Further, the opening is formed in a part of the auxiliary capacitor counter line which corresponds to the region of the second contact hole in the case where the interlayer insulator has a first contact hole and a second contact hole in each picture element region, a switching element of the picture element electrode and the second electrode are connected electrically to each other through the first contact hole, the picture element electrode and the auxiliary capacitor electrode are connected electrically to each other through the second contact hole, and an auxiliary capacitor counter line, such as a control signal line, is arranged opposite the auxiliary capacitor electrode with the control insulator interposed.

According to the present invention, in the active matrix substrate in which the picture element electrode on the interlayer insulator is connected electrically to the electrode arranged in the layer below the interlayer insulator through the contact hole formed in the interlayer insulator and the other electrode is arranged opposite the electrode therebelow with the insulting film interposed for forming the auxiliary capacitor between the electrodes, occurrence of leakage between the electrodes is obviated without inviting lowering of the aperture ratio even if a defect is formed in the insulator between the electrodes in forming the contact hole. Hence, the present invention contributes to manufacture of a high quality and high yield liquid crystal display device.

DETAILED DESCRIPTION OF PREFERRED EMBODIMENTS

Embodiments of the present invention will be described below with reference to the drawings.

Embodiment 1

Figure 1:
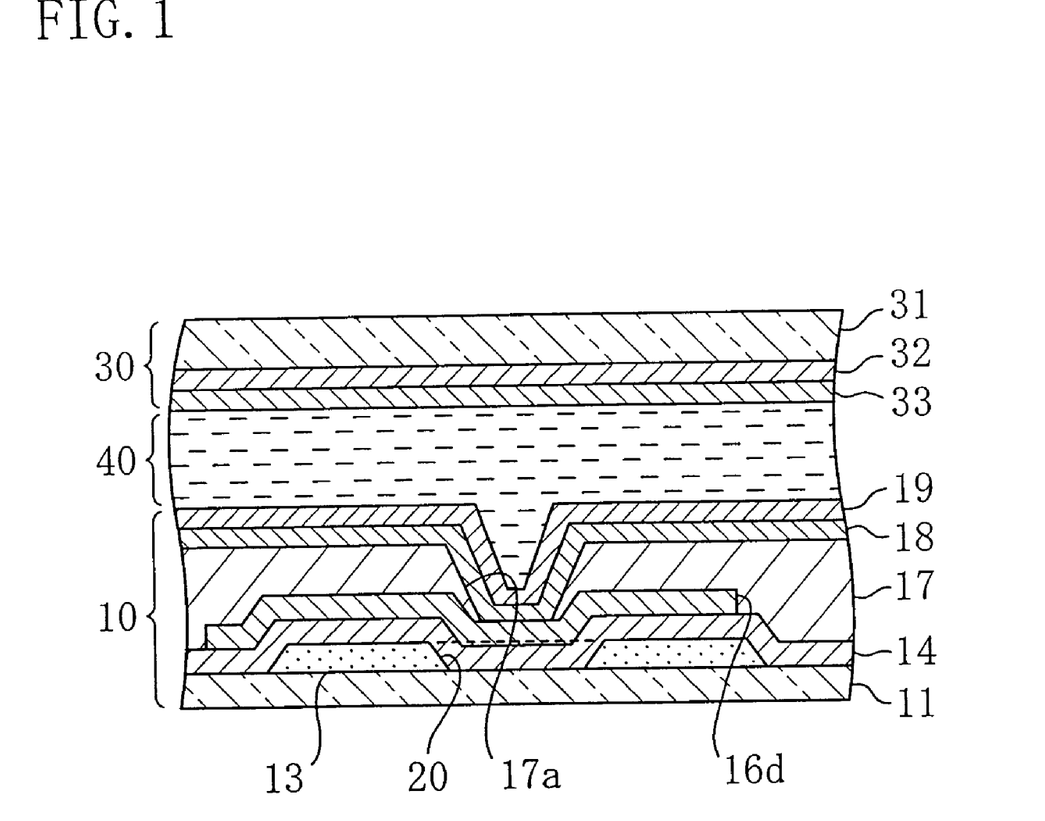
FIG. 1 is a plan view showing a structure of one of picture element regions of an active matrix substrate of a liquid crystal display device according to Embodiment 1 of the present invention when viewed from a counter substrate.
Figure 2:
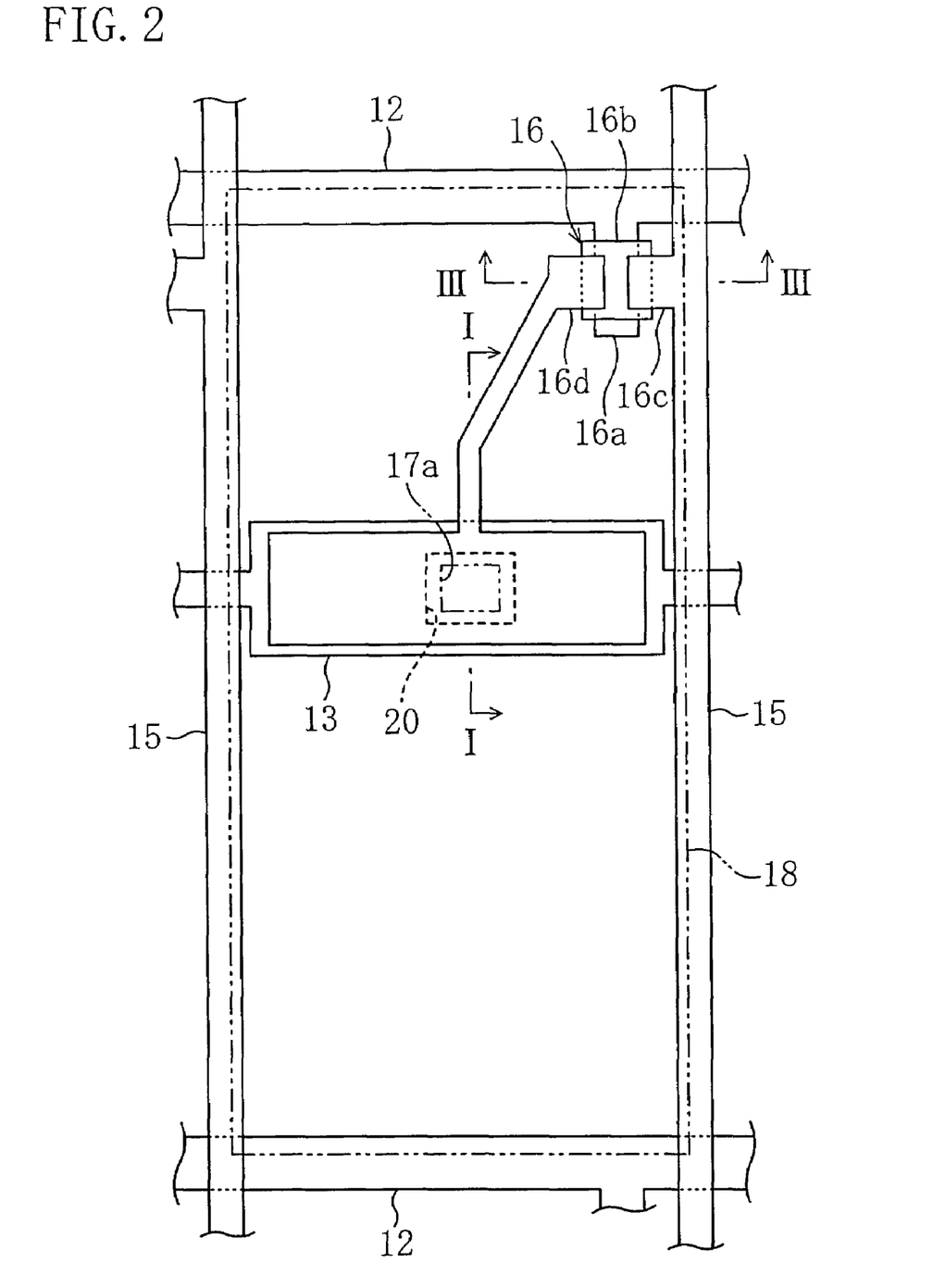
FIG. 2 is an enlarged sectional view taken along the line II-II in FIG. 1.

FIG. 1 and FIG. 2 show a structure of a liquid crystal display device according to Embodiment 1 of the present invention, wherein FIG. 1 is a plan view showing a structure of one of picture element regions of an active matrix substrate when viewed from a counter substrate, and FIG. 2 is a sectional view of the entirety of the liquid crystal display device and corresponds to an enlarged sectional view taken along the line II-II in FIG. 1.

This liquid crystal display device includes, as shown in FIG. 2, an active matrix substrate 10, a counter substrate 30 arranged so as to be opposed to the active matrix substrate 10, and a liquid crystal layer 40 arranged between the active matrix substrate 10 and the counter substrate 30.

Description will be given to a basic structure of the active matrix substrate 10. The active matrix substrate 10 includes a transparent insulating substrate 11 made of glass or the like.

There are provided on the insulating substrate 11 a plurality of gate signal lines 12 as control signal lines arranged so as to extend left and right in FIG. 1, a plurality of gate electrodes 16a as control electrodes branching from the gate signal lines 12, and auxiliary capacitor counter electrodes 13. A gate insulator 14 as a control insulator is provided on the gate signal lines 12, the gate electrodes 16a, and the auxiliary capacitor counter electrodes 13 (hereinafter referred to as Cs counter electrodes). There are provided thereon a semiconductor layer 16b arranged so as to be laid over each gate electrode 16a, a plurality of source signal lines 15 arranged so as to extend in a direction intersected with the gate signal lines 12 (vertically in FIG. 1), source electrodes 16c branching from the source signal lines 15, and drain electrodes 16d. The gate signal lines 12, the gate electrodes 16a, and the Cs counter electrodes 13 are made of metal or alloy having a predetermined resistance, such as tantalum, aluminum, titanium, chromium, or the like or a layered body of Ta/TaN/Ti/Al/Ti or the like. The gate insulator 14 is made of, for example, $SiN_x$ or $SiO_2$, and the semiconductor layer 16b has a layered structure of an amorphous silicon semiconductor layer containing no impurity and an amorphous silicon semiconductor layer containing an impurity. Further, the source signal lines 15, the source electrodes 16c, and the drain electrodes 16d may be made of the same material as the gate signal lines 12, for example, or may be formed of a transparent conductive film, such as an ITO film.

The gate electrodes 16a and the source electrodes 16c are arranged near the intersections of the gate signal lines 12 and the source signal lines 15. The source electrodes 16c and the drain electrodes 16d are arranged so as to be laid over the gate electrodes 16a with the semiconductor layer 16b interposed, thereby forming TFTs 16. An interlayer insulator 17 is provided on the TFTs 16, and picture element electrodes 18 formed of a transparent conducive film, such as an ITO film or the like, are provided on the interlayer insulator 17. Further, an alignment film 19 is provided on the picture element electrodes 18.

In the present embodiment, each picture element region is a substantially rectangular region surrounded by two gate signal lines 12 adjacent in the direction that the source signal lines 15 extend and two source signal lines 15 adjacent in the direction that the gate signal liens 12 extend, and the picture element electrodes 18 are arranged in the respective picture element regions. Adjacent picture element electrodes 18 are separated from each other above the gate signal lines 12 and the source signal lines 15, which allows the picture element electrodes 18 to be out of contact with the gate signal lines 12 and the source signal lines 15, minimizing the space between the separated picture element electrodes 18 to increase the aperture ratio.

Each drain electrode 16d extends from the TFT 16 to the substantial center of the picture element electrode region, and the extending end portion thereof expands in width in the direction that the gate signal lines 12 extend to have a substantially rectangular form. On the other hand, each Cs counter electrode 13 located at the substantial center of the picture element region extends in width in the direction that the gate signal lines 12 extend to have a substantially rectangular form. This rectangular part is arranged so as to be opposed to the rectangular part of the drain electrode 16d with the gate insulator 14 interposed. Further, contact holes 17a are formed in parts of the interlayer insulator 7 which are located between the drain electrodes 16d and the Cs counter electrodes 13 so that the drain electrodes 16d are connected electrically to the picture element electrodes 18 through the contact holes 17a. The Cs counter electrodes 13 between picture element regions adjacent to each other in the direction that the gate signal lines 12 extend are connected electrically to each other.

Briefly referring to a basic structure of the counter substrate 30, it includes a transparent insulating substrate 31 made of glass or the like, similarly to the active matrix substrate 10. A counter electrode 32 made of a transparent conductive film, such as an ITO film, is provided on the insulating substrate 31 across the plurality of picture element regions, and an alignment film 33 is provided thereon.

Figure 3:
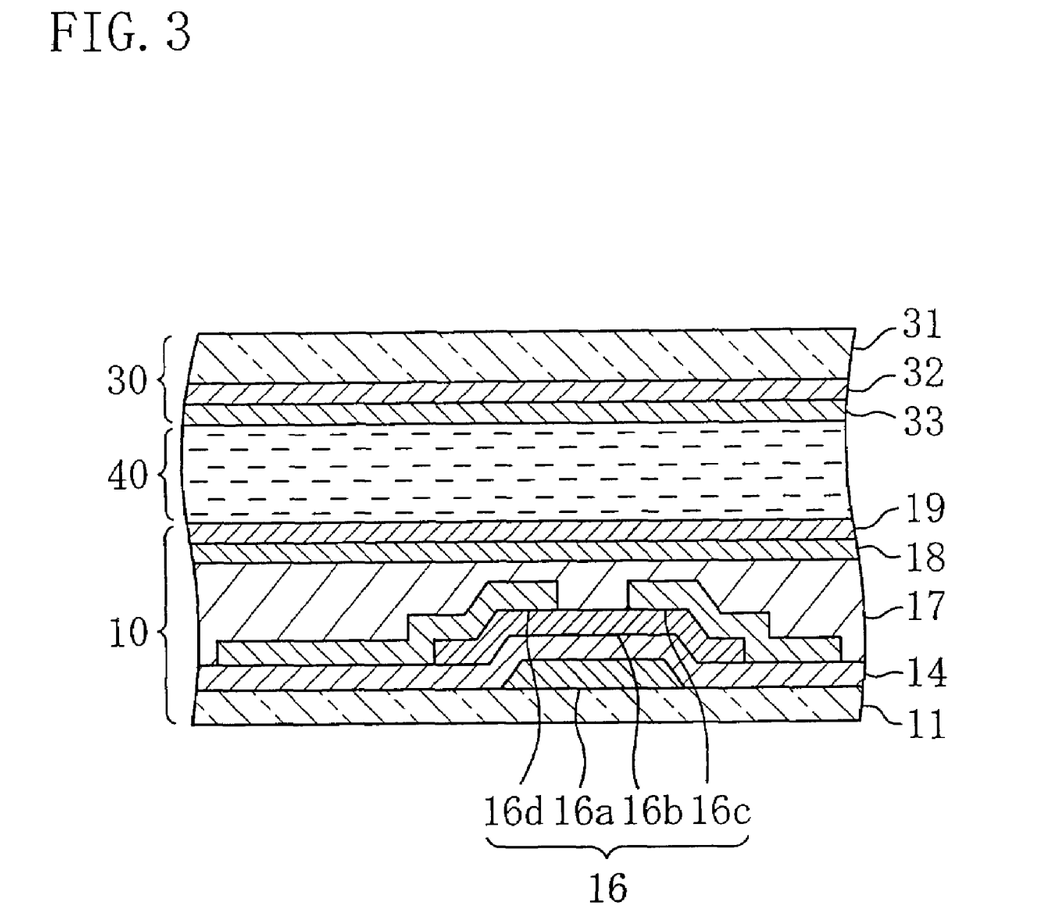
FIG. 3 is view a corresponding to an enlarged sectional view taken along the line III-III in FIG. 1.

Further, in the present embodiment, as shown in FIG. 3 as an enlarged sectional view taken along the line III-III in FIG. 1, an opening 20 substantially in a rectangular form is formed in a part of each Cs counter electrode 13 which is located under the corresponding contact hole 17a.

Specifically, the size and the location of the opening 20 are so set to range over the whole region of the contact hole 17a.

Description will be made herein to a method for manufacturing the active matrix substrate 10 of the liquid crystal display device structured as above.

A metal film of tantalum as one example is formed on a transparent insulating substrate 11 made of glass or the like, and the metal film is formed into gate signal lines 12, gate electrodes 16a, and Cs counter electrodes 13 by a photolithography step and an etching step by dry etching or the like. Namely, in the present embodiment, the Cs counter electrodes 13 are made of the same material as the gate signal lines 12 and are formed simultaneously with the gate signal lines 12. In this formation, parts of the metal film which correspond to openings 20 of the Cs counter electrodes 3 are patterned to have a form corresponding to the openings 20.

Next, an amorphous silicon semiconductor layer containing no impurity and an amorphous silicon semiconductor layer containing an impurity are formed sequentially on the gate electrodes 16a by CVD, and the semiconductor layers are patterned into an island form by a photolithography step and an etching step to form a semiconductor layer 16b. Then, a metal film of tantalum as one example is formed and patterned by a photolithography step, and then, etching is performed to form source signal lines 15, source electrodes 16c, and drain electrodes 16d. In this formation, the drain electrodes 16d are formed so as to cover the whole regions of the Cs counter electrodes 13 including the openings 20. Thereafter, an interlayer insulator 17 is formed by coating a photosensitive resin. The interlayer insulator 17 may be formed by CVD of $SiN_x$, $SiO_2$, or the like. Contact holes 17a are formed in the interlayer insulator 17 by a photolithography step and an etching step. The contact holes 17a are located so as to be opposed to the openings 20. Then, a transparent conductive film is formed on the interlayer insulator 17 so as to be connected to the drain electrodes 16d through the contact holes 17a and is patterned to form picture element electrodes 18.

After the above steps are performed, an alignment film 19 is provide to thus obtain the active matrix substrate 10 according to the present embodiment.

As described above, in the present embodiment, in the active matrix substrate 10 of the liquid crystal display device in which the picture element electrodes 18 on the interlayer insulator 17 and the drain electrodes 16d located in the layer below the interlayer insulator 17 are connected electrically to each other through the contact holes 17a formed in the interlayer insulator 17 and the Cs counter electrodes 13 are arranged under the drain electrodes 16d with the gate insulator 14 interposed for forming auxiliary capacitors between the electrodes 16d and 13, the Cs counter electrodes 13 are not present under the contact hole 17a. Therefore, in the case where a defect is formed in any drain electrode 16d, even if a defect is formed in the gate insulator 14 through the defect in forming the contact hole 17a by etching the interlayer insulator 17, occurrence of leakage between the drain electrode 16d and the corresponding Cs counter electrode 13 caused due to the defect in the gate insulator 14 can be suppressed. Further, the regions of the liquid crystal layer 40 which correspond to the openings 20 are shielded by the drain electrodes 16d, and therefore, no contrast lowering caused due to the presence of the openings 20 is invited. In addition, because the regions of the liquid crystal layer 40 which correspond thereto are shielded by the Cs counter electrodes 13 in principle, no lowering of the aperture ratio is invited though the auxiliary capacitance is reduced by the openings 20.

Thus, occurrence of leakage between the drain electrodes 16d and the Cs counter electrodes 13 caused due to a defect in the gate insulator 14 can be suppressed with no lowering of the contrast and the aperture ratio invited, enabling manufacture of a high quality liquid crystal display device with a high yield.

Conventional arrangement of the contact holes 17a in regions other than the Cs counter electrodes 13 restricts the shape of the drain electrodes 16d to a protruding shape or the like. In contrast, in the present embodiment, the contact holes 17a arranged in the regions of the Cs counter electrodes 13 allow the drain electrodes 16d to be free from such shape restriction, leading to effective layout of a liquid crystal display device with an increased aperture ratio.

It is noted that though the size and the location of the openings 20 are set so that the openings 20 range over the whole regions of the contact holes 17a in the above embodiment, these may be set arbitrarily according to a condition required (for example, auxiliary capacitance).

Though the drain electrodes 16d are used for shielding the regions of the liquid crystal layer 40 which correspond to the openings 20 in the above embodiment, existing elements (the picture element electrodes 18, for example) other than the drain electrodes 16d may be used or an exclusive shielding layer may be provided additionally.

Moreover, the Cs counter electrodes 13 are made of the same material as the gate signal lines 12 and are formed simultaneously with the gate signal lines 12 in the above embodiment, but the material and the formation timing may be set arbitrarily.

In addition, the above embodiment describes the case where the active matrix substrate 10 is used for a liquid crystal display device, but the active matrix substrate 10 may be used for an organic EL display device, for example.

Embodiment 2

Figure 4:
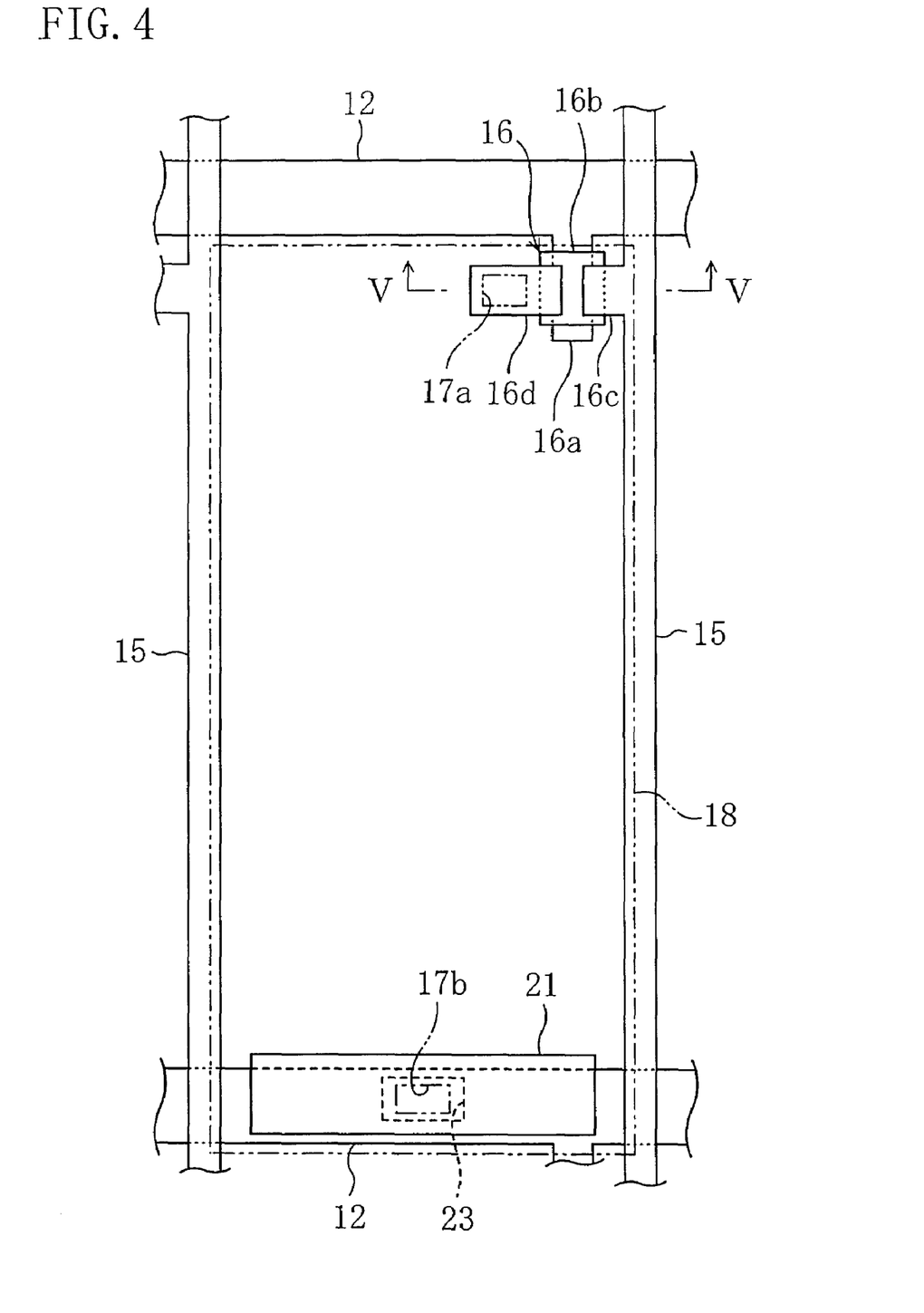
FIG. 4 is a view showing a structure of one of picture element regions of a liquid crystal display device according to Embodiment 2 of the present invention and corresponds to FIG. 1.
Figure 5:
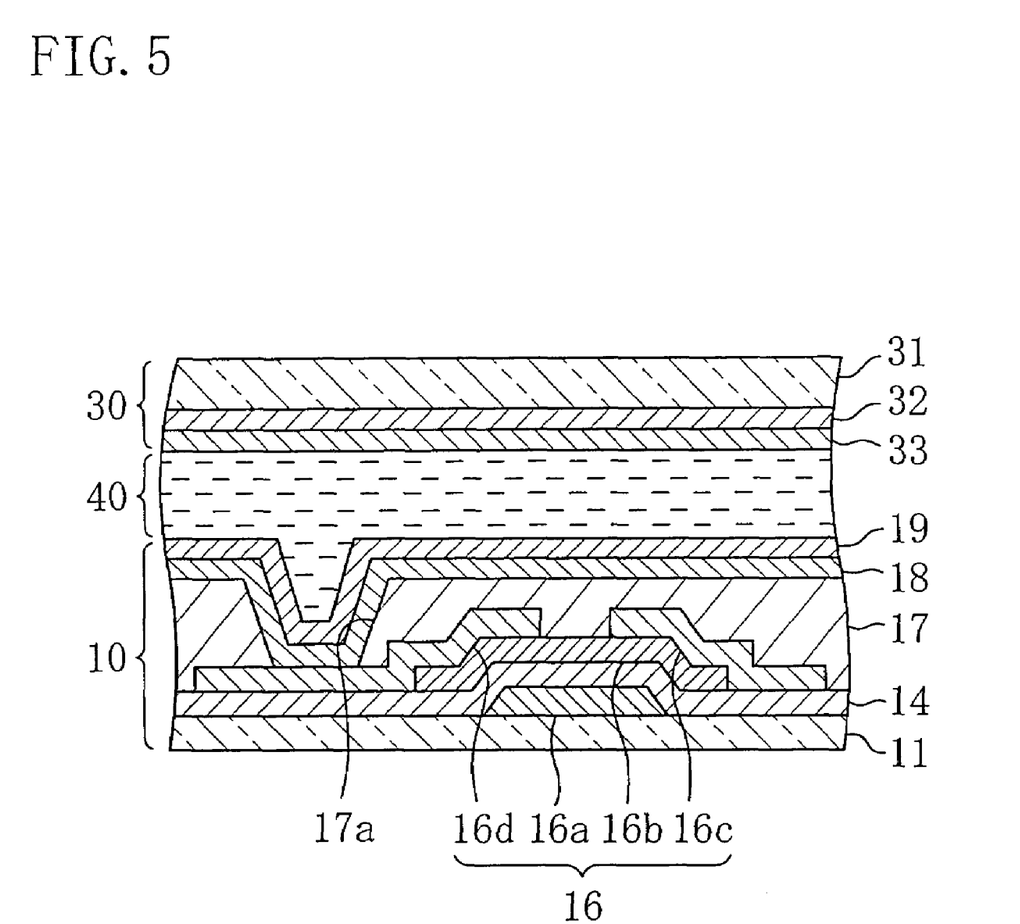
FIG. 5 is an enlarged sectional view taken along the line V-V in FIG. 4.

FIG. 4 and FIG. 5 show a structure of a main part of a liquid crystal display device according to Embodiment 2 of the present invention, wherein FIG. 4 is a plan view showing a structure of one of picture element regions of the active matrix substrate 10 when viewed from the counter electrode 30, and FIG. 5 is a sectional view of the entirety of the liquid crystal display device and corresponds to an enlarged sectional view taken along the line V-V in FIG. 4. The same reference numerals are assigned to the same elements as in Embodiment 1.

In the present embodiment, two contact holes of first and second contact holes 17a, 17b are formed in the interlayer insulator 17 in each picture element region.

The first contact hole 17a is located near the TFT 16 for establishing electrical connection between the drain electrode 16d and the picture element electrode 18. On the other hand, the second contact hole 17b is located at a gate signal line 12 out of two gate signal lines 12 passing in the boundary part of adjacent picture element regions which is located opposite the TFT 16.

On the interlayer insulator 17 in the region of the second contact hole 17b, an auxiliary capacitor electrode 21 (hereinafter referred to as a Cs electrode) is provided. The Cs electrode 21 is substantially in a rectangular form extending along the gate signal lines 12. Wherein, the Cs electrodes 21 in respective picture element regions adjacent to each other in the direction that the gate signal lines 12 extend are separated from each other.

A gate signal line 12 out of two gate signal lines 12 located in the boundary part of adjacent picture element regions which is located opposite the TFT 16 (lower side in FIG. 4) has substantially the same width as the Cs electrode 21 and is displaced toward the picture element region (upward in FIG. 4) so as to be opposed to the Cs electrode 21. This gate signal line 12 forms an auxiliary capacitor counter line in the present invention.

In the present embodiment, an opening 22 is formed in a part of the gate signal line 12 which corresponds to the region of the second contact hole 17b. Specifically, the size and the location of the opening 22 are set so that the opening 22 ranges over the whole region of the second contact hole 17b.

As described above, in the present embodiment, the active matrix substrate 10 in which the picture element electrodes 18 on the interlayer insulator 17 are connected electrically to the drain electrodes 16d and the Cs electrodes 21 located in the layer below the interlayer insulator 17 through the first and second contact holes 17a, 17b, respectively, and the gate signal lines 12 are arranged below the Cs electrodes 21 with the gate insulator 14 interposed for forming auxiliary capacitors between the Cs electrodes 21 and the gate signal lines 12, parts of the gate signal lines 12 which correspond to the regions of the second contact holes 17b are located correspondingly to the openings 22 where the gate signal lines 12 are not present. Therefore, in the case where a defect is formed in any Cs electrode 21, even if a defect is formed in the gate insulator 14 through the defect in forming the second contact holes 17b by etching the interlayer insulator 17, occurrence of leakage between the Cs electrode 21 and the corresponding gate signal line 12 caused due to the defect in the gate insulator 14 can be suppressed. Further, the regions of the liquid crystal layer 40 which correspond to the openings 22 is shielded by the Cs electrodes 21, and therefore, no contrast lowering cause due to the presence of the opening 22 is invited. In addition, because the regions of the liquid crystal layer 40 which correspond thereto are shielded by the Cs electrodes 21 in principle, no lowering of the aperture ratio is invited though the auxiliary capacitance is reduced by the openings 22.

It is noted that though the auxiliary capacitor counter lines are formed of the gate signal lines 12 in the above embodiment, the auxiliary capacitor counter lines may be formed of existing elements other than the gate signal lines 12 or an exclusive auxiliary capacitor counter lines may be provided additionally.

Embodiment 3

Figure 6:
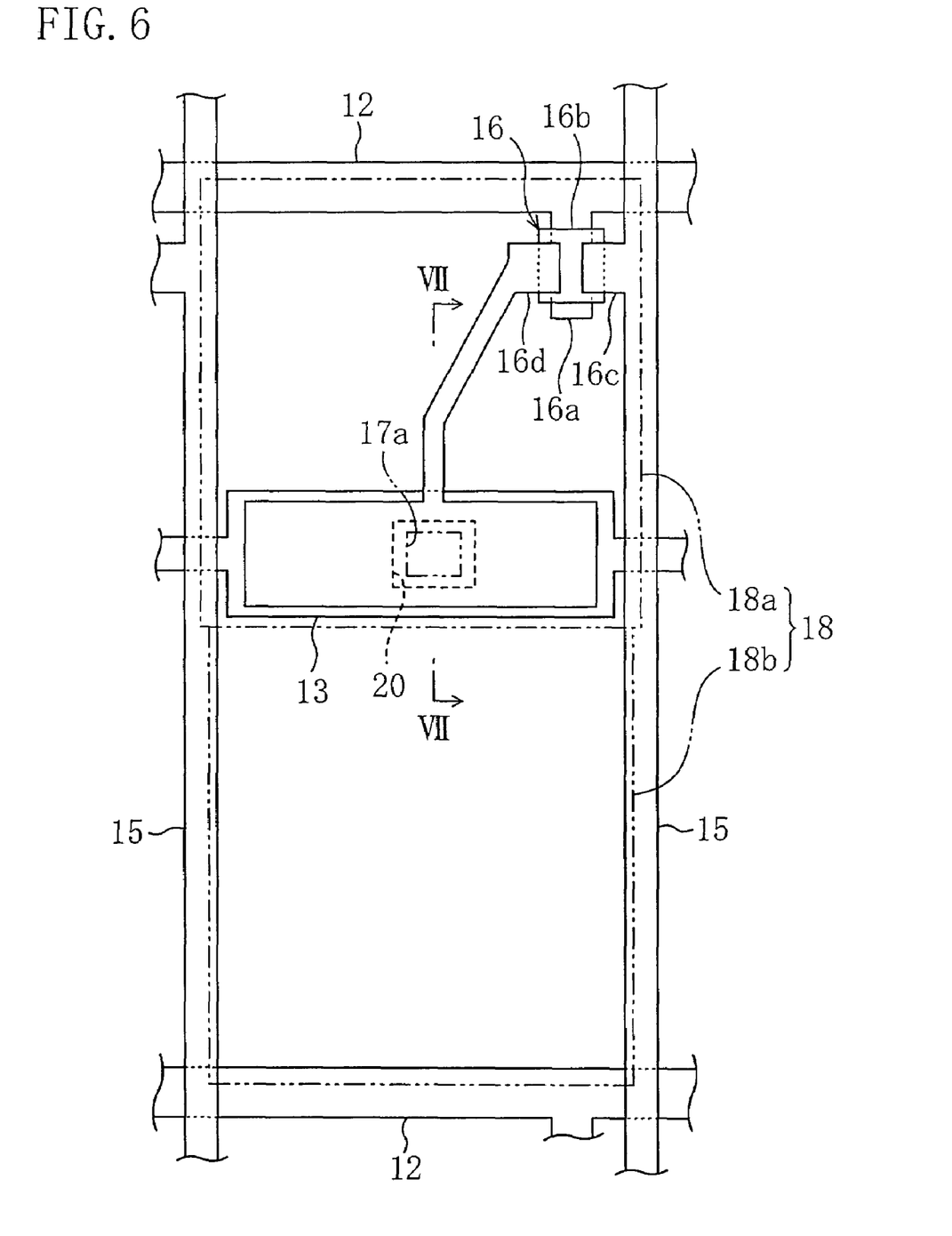
FIG. 6 is a view showing a structure of one of picture element regions of a liquid crystal display device according to Embodiment 3 of the present invention and corresponds to FIG. 1.
Figure 7:
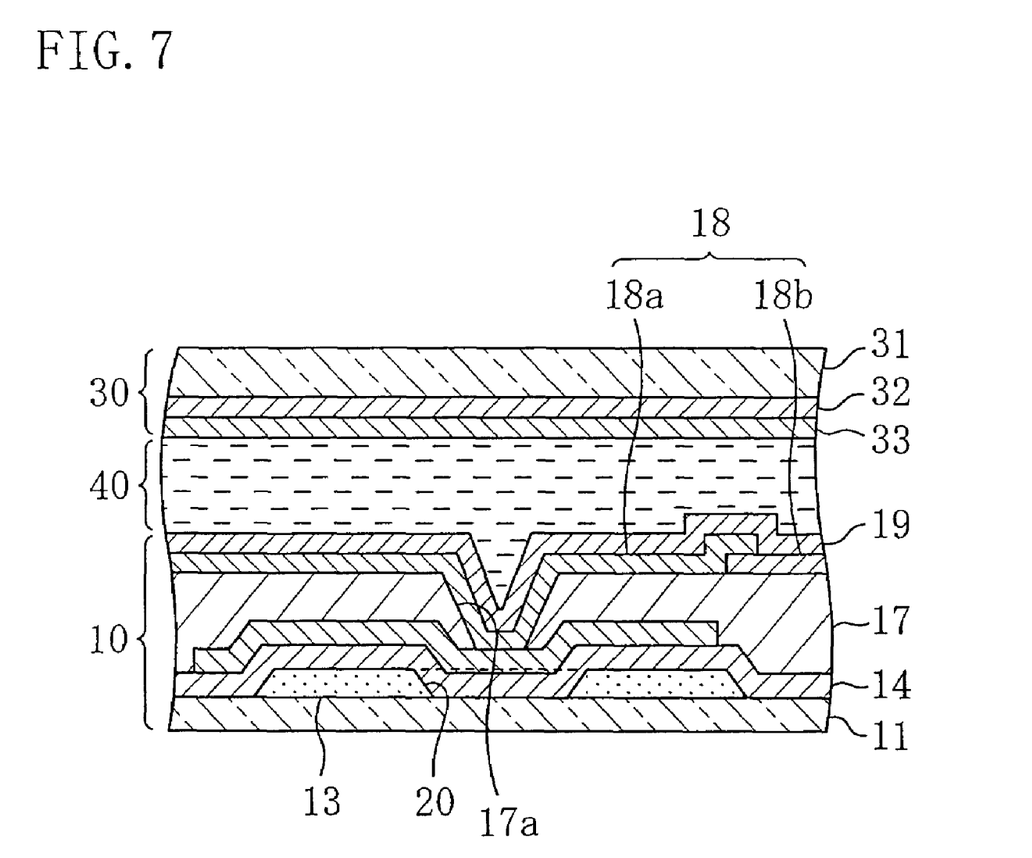
FIG. 7 is an enlarged sectional view taken along the line VII-VII in FIG. 6.

FIG. 6 and FIG. 7 shows a structure of a main part of a liquid crystal display device according to Embodiment 3 of the present invention, wherein FIG. 6 is a plan view showing a structure of one of picture element regions of the active matrix substrate 10 when viewed from the counter electrode 30, and FIG. 7 is a sectional view of the entirety of the liquid crystal display device and corresponds to an enlarged sectional view taken along the line VII-VII in FIG. 6. The same reference numerals are assigned to the same elements as in Embodiment 1

In the present embodiment, a part of each picture element electrode 18 is formed of a reflective conductive film 18a made of metal having a high reflectivity, such as Al.

Specifically, a part (a part on the upper side in FIG. 6) of each picture element electrode 18 which corresponds to the region of the TFT 16 including the region of the drain electrode 16d and the Cs counter electrode 13 is formed of the reflective conductive film 18a while the remaining part (a part on the lower side in FIG. 6) of each picture element electrode 18 is formed of a transparent conductive film 18b similarly to Embodiment 1. Electrical connection between the reflective conductive film 18a and the transparent conductive film 18b is established by overlapping the end portion of the reflective conductive film 18a with the end portion of the transparent conductive film 18b. In detail, in manufacturing the active matrix substrate 10, the transparent conductive film 8b is formed first on the interlayer insulator 17, and then, the reflective conductive film 18a is formed so that the end portion thereof is overlapped with the end portion of the transparent conducive film 18b. The other constitution is the same as that in Embodiment 1, and therefore, description thereof is omitted.

Hence, substantially the same effects as in Embodiment 1 can be obtained in the present embodiment.

It is noted that though the region on the TFT 16 side with respect to the Cs counter electrode 13 serves as a reflection region while the opposite region serves as a transmission region, the region on the TFT 16 side may serve as the transmission region with the opposite region serving as the reflection region to the contrary.

The invention claimed is:

1. An active matrix substrate comprising:
   an insulating substrate;
   a plurality of control signal lines arranged on the insulating substrate;
   a control insulator provided so as to cover the plurality of control signal lines;
   a plurality of data signal lines arranged on the control insulator so as to intersect with the plurality of control signal lines;
   a switching element provided in each picture element region, the switching element including a control electrode connected electrically to the corresponding control signal line, a first electrode connected electrically to the corresponding data signal line, and a second electrode arranged on the control insulator;
   an interlayer insulator having a contact hole in each picture element region and provided so as to cover each switching element;
   a picture element electrode provided so as to be arranged on the interlayer insulator in each picture element region and connected electrically to the second electrode of the switching element through the contact hole in each picture element region; and
   an auxiliary capacitor counter electrode arranged so as to be opposed to the second electrode with the control insulator interposed for forming an auxiliary capacitor between itself and the second electrode,
   wherein an opening is formed in a part of the auxiliary capacitor counter electrode which corresponds to a region of the contact hole.

2. The active matrix substrate of claim 1,
   wherein the opening ranges over a whole region of the contact hole.

3. The active matrix substrate of claim 1,
   wherein the picture element electrode is formed of a transparent conductive film, and
   the second electrode and the auxiliary capacitor counter electrode are formed of a transparent conductive film.

4. The active matrix substrate of claim 1,
   wherein the picture element electrode is formed of a transparent conductive film,
   the active matrix substrate further comprising:
   a shielding layer for shielding light transmitting in the region of the contact hole.

5. The active matrix substrate of claim 4,
   wherein the second electrode is formed of a non-transmissive conductive film that does not allow light to transmit therethrough, and
   the shielding layer is composed of the second electrode.

6. The active matrix substrate of claim 1,
   wherein at least a part of the picture element electrode which corresponds to the region of the contact hole is formed of a reflective conductive film that reflects light.

7. The active matrix substrate of claim 1,
   wherein the auxiliary capacitor counter electrode is made of the same material as the control signal lines.

8. A liquid crystal display device, comprising:
   the active matrix substrate of claim 1;
   a counter substrate arranged so as to be opposed to the active matrix substrate; and
   a liquid crystal layer arranged between the active matrix substrate and the counter substrate.

9. An active matrix substrate comprising:
   an insulating substrate;
   a plurality of control signal lines arranged on the insulating substrate;
   a control insulator provided so as to cover the plurality of control signal lines;
   a plurality of data signal lines arranged on the control insulator so as to intersect with the plurality of control signal lines;
   a switching element provided in each picture element region, the switching element including a control electrode connected electrically to the corresponding control signal line, a first electrode connected electrically to the corresponding data signal line, and a second electrode arranged on the control insulator;
   an interlayer insulator having a first contact hole and a second contact hole in each picture element region and provided so as to cover each switching element;
   a picture element electrode provided so as to be arranged on the interlayer insulator in each picture element region and connected electrically to the second electrode of the switching element through the first contact hole in each picture element region;
   an auxiliary capacitor electrode provided so as to be arranged between the control insulator and the interlayer insulator in each picture element region and connected electrically to the picture element electrode through the second contact hole; and
   an auxiliary capacitor counter line arranged so as to be opposed to the auxiliary capacitor electrode with the control insulator interposed for forming an auxiliary capacitor between itself and the auxiliary capacitor electrode, wherein an opening is formed in a part of the auxiliary capacitor counter line which corresponds to a region of the second contact hole.

10. The active matrix substrate of claim 9, wherein the auxiliary capacitor counter line serves as the control signal lines.

11. A liquid crystal display device comprising:
the active matrix substrate of claim 9;
a counter substrate arranged so as to be opposed to the active matrix substrate; and
a liquid crystal layer arranged between the active matrix substrate and the counter substrate.

* * * * *

UNITED STATES PATENT AND TRADEMARK OFFICE
CERTIFICATE OF CORRECTION

| | |
|---|---|
| PATENT NO. | : 7,834,948 B2 |
| APPLICATION NO. | : 11/569994 |
| DATED | : November 16, 2010 |
| INVENTOR(S) | : Naoki Takeda et al. |

Page 1 of 1

It is certified that error appears in the above-identified patent and that said Letters Patent is hereby corrected as shown below:

Replace item (22) on the cover page of the patent with the following corrected information:

(22)   PCT Filed:   Jun. 13, 2005

Signed and Sealed this
Twenty-second Day of February, 2011

David J. Kappos
*Director of the United States Patent and Trademark Office*